United States Patent
Zhong et al.

(10) Patent No.: US 10,130,005 B2
(45) Date of Patent: Nov. 13, 2018

(54) ELECTRONIC PRODUCT

(71) Applicant: Huawei Technologies Co., Ltd., Shenzhen, Guangdong (CN)

(72) Inventors: Lei Zhong, Shenzhen (CN); Linfang Jin, Shenzhen (CN); Jie Zou, Shenzhen (CN); Nanbo Kang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/507,597

(22) PCT Filed: Aug. 29, 2014

(86) PCT No.: PCT/CN2014/085514
§ 371 (c)(1),
(2) Date: Feb. 28, 2017

(87) PCT Pub. No.: WO2016/029430
PCT Pub. Date: Mar. 3, 2016

(65) Prior Publication Data
US 2017/0290197 A1 Oct. 5, 2017

(51) Int. Cl.
*H05K 7/20* (2006.01)
*H01H 23/16* (2006.01)
(Continued)

(52) U.S. Cl.
CPC ......... *H05K 7/20172* (2013.01); *H01C 7/008* (2013.01); *H01H 23/164* (2013.01);
(Continued)

(58) Field of Classification Search
CPC ............... H05K 5/0213; H05K 7/1427; H05K 7/20181; H05K 7/20209; H05K 2201/10053; H05K 2201/10196
(Continued)

(56) References Cited

U.S. PATENT DOCUMENTS 5,297,004 A * 3/1994 Mazura .................. H02B 1/56
361/690
6,694,759 B1 * 2/2004 Bash .................. G05D 16/206
62/180
(Continued)

FOREIGN PATENT DOCUMENTS

CN 101431881 A 5/2009
CN 101435985 A 5/2009
(Continued)

OTHER PUBLICATIONS

JP 2014-157937, Aug. 28, 2014, English Machine Translation.*
EP 0158122, Oct. 16, 1985, English Machine Translation.*
DE 3230282, Feb. 16, 1984, English Machine Translation.*

*Primary Examiner* — Anatoly Vortman

(57) ABSTRACT

An electronic product, including: a housing, where an air vent is disposed on the housing; a PCB board that is located inside the housing, where a positive electrode and a negative electrode of a power supply are disposed on the PCB board; a fan that is located between the PCB board and the housing; and a switch bar that is located between the fan and the housing and is connected to the housing in a sliding manner, where the switch bar has a first state and a second state, where the switch bar includes a conductive area, when the switch bar is set to the first state, the conductive area is electrically connected to the positive electrode and the negative electrode of the power supply on the PCB board, the fan starts to run.

10 Claims, 5 Drawing Sheets

(51) Int. Cl.
*H05K 1/18* (2006.01)
*H01C 7/00* (2006.01)
*H05K 7/14* (2006.01)
*H05K 5/02* (2006.01)

(52) U.S. Cl.
CPC ........... *H05K 1/181* (2013.01); *H05K 5/0213* (2013.01); *H05K 7/1427* (2013.01); *H05K 7/20181* (2013.01); *H05K 7/20209* (2013.01); *H05K 2201/10053* (2013.01); *H05K 2201/10196* (2013.01)

(58) Field of Classification Search
USPC ......................................................... 361/720
See application file for complete search history.

(56) References Cited

U.S. PATENT DOCUMENTS

| | | | | |
|---|---|---|---|---|
| 7,508,663 B2* | 3/2009 | Coglitore | ........... | H05K 7/20736 165/122 |
| 7,656,664 B2* | 2/2010 | Ye | ...................... | H05K 7/20154 361/691 |
| 7,663,881 B2* | 2/2010 | Kuo | ........................ | G06F 1/20 312/223.2 |
| 7,715,193 B1* | 5/2010 | Ye | ...................... | H05K 7/20145 312/236 |
| 8,369,084 B2* | 2/2013 | Chen | ....................... | G06F 1/203 361/679.47 |
| 8,498,115 B2* | 7/2013 | Chen | .................. | H05K 7/20172 361/695 |
| 8,517,054 B2* | 8/2013 | Lai | ..................... | H05K 7/20727 137/625.3 |
| 2005/0034468 A1 | 2/2005 | Dietz et al. | | |
| 2009/0323280 A1* | 12/2009 | Wu | .................... | H05K 7/20181 361/690 |
| 2010/0084123 A1* | 4/2010 | Shishido | ............... | F04D 29/582 165/200 |
| 2010/0167636 A1* | 7/2010 | Bhattacharya | .......... | G06F 1/206 454/239 |
| 2011/0134605 A1* | 6/2011 | Chou | ..................... | G06F 1/203 361/679.48 |
| 2012/0273172 A1* | 11/2012 | Cao | .......................... | G06F 1/20 165/121 |

FOREIGN PATENT DOCUMENTS

| | | | | |
|---|---|---|---|---|
| CN | 102759972 A | | 10/2012 | |
| CN | 204191059 U | | 3/2015 | |
| DE | 3230282 A1 | * | 2/1984 | ............. H01H 15/06 |
| EP | 0158122 A2 | * | 10/1985 | ........... H01H 15/005 |
| JP | H05235575 A | | 9/1993 | |
| JP | 2000305175 A | | 11/2000 | |
| JP | 2004151946 A | | 5/2004 | |
| JP | 2012235094 A | | 11/2012 | |
| JP | 2013186543 A | | 9/2013 | |
| JP | 2014157937 A | | 8/2014 | |
| WO | 2012046313 A1 | | 4/2012 | |
| WO | 2013014719 A1 | | 1/2013 | |

* cited by examiner

ELECTRONIC PRODUCT

CROSS REFERENCE TO RELATED APPLICATIONS

The present application claims priority under 35 U.S.C. § 365 to International Patent Application No. PCT/CN2014/085514 filed Aug. 29, 2014 which is incorporated herein by reference in its entirety.

TECHNICAL FIELD

The present invention relates to the field of heat dissipation technologies, and in particular, to an electronic product.

BACKGROUND

With continuous improvement in performance of electronic products such as a wireless WAN card and a data card, energy consumption of the electronic products also correspondingly and substantially increases. A heat dissipation manner of the electronic products in the prior art is mainly natural heat dissipation, that is, heat exchange performed between air that naturally flows in the external environment and air inside the electronic products to achieve heat dissipation. However, heat dissipation efficiency in this heat dissipation manner is relatively low, which causes relatively low reliability and a relatively short service life of an electronic product that uses the heat dissipation manner to dissipate heat.

SUMMARY

To resolve the foregoing technical problem, embodiments of the present invention provide an electronic product. Heat dissipation efficiency of the electronic product is relatively high, and the electronic product has relatively high reliability and a relatively long service life.

To resolve the foregoing problem, the embodiments of the present invention provide the following technical solutions:

According to a first aspect, the present invention provides an electronic product, including:

a housing, where an air vent is disposed on the housing;

a PCB board that is located inside the housing, where a positive electrode and a negative electrode of a power supply are disposed on the PCB board;

a fan that is located between the PCB board and the housing, where a projection of the fan on the PCB board overlaps a projection of the air vent on the PCB board; and a switch bar that is located between the fan and the housing and is connected to the housing in a sliding manner, where the switch bar has a first state in which the air vent is not completely blocked and a second state in which the air vent is completely blocked, where the switch bar includes a conductive area, and when the switch bar is set to the first state, the conductive area is electrically connected to the positive electrode and the negative electrode of the power supply on the PCB board, to provide a first drive signal to the fan and enable the fan to run.

In a first possible implementation manner of the first aspect, the projection of the fan on the PCB board coincides with the projection of the air vent on the PCB board.

With reference to the first aspect or the first possible implementation manner of the first aspect, in a second possible implementation manner, the switch bar includes a ventilation area and a non-ventilation area that encloses the ventilation area, and the switch bar has the first state in which the ventilation area directly faces the air vent and the second state in which the non-ventilation area completely blocks the air vent, where the conductive area is located in the non-ventilation area of the switch bar, and when the switch bar is set to the first state, the conductive area is electrically connected to the positive electrode and the negative electrode of the power supply on the PCB board, to provide the first drive signal to the fan and enable the fan to run.

With reference to the second possible implementation manner of the first aspect, in a third possible implementation manner, a projection of the ventilation area on the PCB board covers the projection of the air vent on the PCB board.

With reference to the second possible implementation manner or the third possible implementation manner of the first aspect, in a fourth possible implementation manner, the non-ventilation area further includes an insulation area, and the insulation area is located between the conductive area and the ventilation area and encloses the ventilation area.

With reference to any one of the second possible implementation manner to the fourth possible implementation manner of the first aspect, in a fifth possible implementation manner, the ventilation area is a through hole that penetrates the switch bar.

With reference to the fifth possible implementation manner of the first aspect, in a sixth possible implementation manner, the electronic product further includes an air filter that is located in the ventilation area of the switch bar, and the air filter filters air that passes through the ventilation area.

With reference to the sixth possible implementation manner of the first aspect, in a seventh possible implementation manner, the air filter and the switch bar are permanently bonded.

With reference to the first aspect or any one of the foregoing possible implementation manners of the first aspect, in an eighth possible implementation manner, the conductive area is a conductive copper sheet.

With reference to the first aspect or any one of the foregoing possible implementation manners of the first aspect, in a ninth possible implementation manner, the electronic product further includes a thermistor disposed on the PCB board and a temperature switch disposed on the PCB board; the thermistor is configured to: receive the first drive signal, detect temperature of the electronic product when receiving the first drive signal, convert a temperature signal detected by the thermistor into an electrical signal, and output the electrical signal to the temperature switch; and the temperature switch is configured to: determine the electrical signal output by the thermistor, and output a second drive signal to the fan when the electrical signal reaches a preset value of the electrical signal, where the fan starts to run when receiving the second drive signal.

With reference to the first aspect or any one of the foregoing possible implementation manners of the first aspect, in a tenth possible implementation manner, the electronic product further includes a rocker switch that is connected to the switch bar in a fastened manner, and switch between states of the switch bar is implemented by using the rocker switch.

Compared with the prior art, the foregoing technical solutions have the following advantages:

The electronic product provided in the embodiments of the present invention includes: the housing, where the air vent is disposed on the housing; the PCB board that is located inside the housing, where the positive electrode and the negative electrode of the power supply are disposed on the PCB board; the fan that is located between the PCB board and the housing, where the projection of the fan on the PCB board overlaps the projection of the air vent on the PCB board; and the switch bar that is located between the fan and the housing and is connected to the housing in the sliding manner, where the switch bar has the first state in which the air vent is not completely blocked and the second state in which the air vent is completely blocked, where the switch bar includes the conductive area, when the switch bar is set to the first state, the conductive area is electrically connected to the positive electrode and the negative electrode of the power supply on the PCB board, to provide the first drive signal to the fan, and the fan starts to run.

It can be learned that, when the electronic product provided in the embodiments of the present invention works, the switch bar may be set to the first state, and the fan is used to perform active heat dissipation by using the air vent disposed on the housing, to enhance heat exchange between air in the external environment and air inside the electronic product. This can improve heat dissipation efficiency of the electronic product, improve reliability of the electronic product, and prolong a service life of the electronic product.

In addition, when the electronic product provided in the embodiments of the present invention does not work, the switch bar may be set to the second state, and the air vent on the housing is blocked by using the switch bar, so as to avoid a case in which performance of the electronic product is affected and the service life of the electronic product is shortened because dust in the external environment enters the inside of the electronic product through the air vent on the housing.

DETAILED DESCRIPTION

Figure 1:
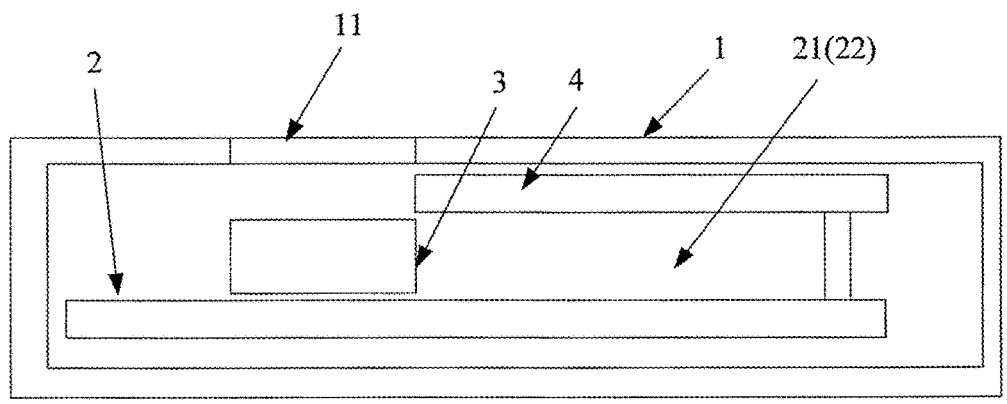
FIG. 1 is a schematic structural diagram in which a switch bar is set to a first state in an electronic product according to an embodiment of the present invention.

As described in the background, an electronic product in the prior art mainly uses a manner of natural heat dissipation to dissipate heat. However, heat dissipation efficiency in this heat dissipation manner is relatively low, which causes relatively low reliability and a relatively short service life of an electronic product that uses the heat dissipation manner to dissipate heat.

In view of this, embodiments of the present invention provide an electronic product, including:

a housing, where an air vent is disposed on the housing;

a PCB board that is located inside the housing, where a positive electrode and a negative electrode of a power supply are disposed on the PCB board;

a fan that is located between the PCB board and the housing, where a projection of the fan on the PCB board overlaps a projection of the air vent on the PCB board; and a switch bar that is located between the fan and the housing and is connected to the housing in a sliding manner, where the switch bar has a first state in which the air vent is not completely blocked and a second state in which the air vent is completely blocked, where the switch bar includes a conductive area, when the switch bar is set to the first state, the conductive area is electrically connected to the positive electrode and the negative electrode of the power supply on the PCB board, to provide a first drive signal to the fan, and the fan starts to run.

It can be learned that, when the electronic product provided in the embodiments of the present invention works, the switch bar may be set to the first state, and the fan is used to perform active heat dissipation by using the air vent disposed on the housing, to enhance heat exchange between air in the external environment and air inside the electronic product. This can improve heat dissipation efficiency of the electronic product, improve reliability of the electronic product, and prolong a service life of the electronic product.

In addition, when the electronic product provided in the embodiments of the present invention does not work, the switch bar may be set to the second state, and the air vent on the housing is blocked by using the switch bar, so as to avoid a case in which performance of the electronic product is affected and the service life of the electronic product is shortened because dust in the external environment enters the inside of the electronic product through the air vent on the housing.

To make the foregoing objectives, features, and advantages of the present invention clearer and more comprehensible, the following describes specific implementation manners of the present invention in detail with reference to the accompanying drawings.

In the following description, specific details are given to facilitate full understanding of the present invention. However, the present invention can be implemented in multiple other manners different from those described herein, and a person skilled in the art may implement similar promotion without violating the connotation of the present invention. Therefore, the present invention is not limited to the following disclosed embodiments.

As shown in FIG. 1, an embodiment of the present invention provides an electronic product, including a housing 1, a PCB board 2, a fan 3, and a switch bar 4.

Figure 2:
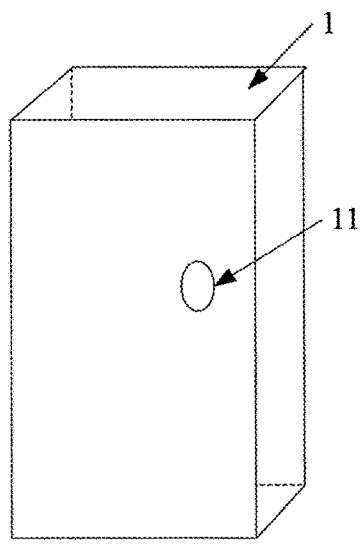
FIG. 2 is a schematic structural diagram of a housing appearance of an electronic product according to an embodiment of the present invention.

As shown in FIG. 2, an air vent 11 is disposed on the housing 1, so that air in the external environment may enter the inside of the housing 1 of the electronic product through the air vent 11 and perform heat exchange with air inside the housing 1.

Figure 3:
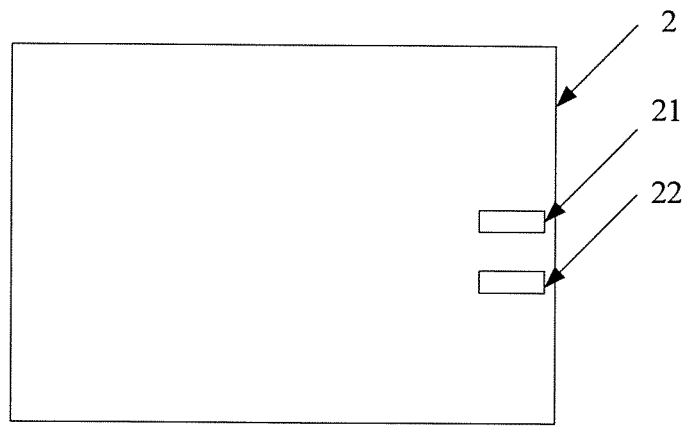
FIG. 3 is a schematic structural diagram of a PCB board in an electronic product according to an embodiment of the present invention.

The PCB board 2 is located inside the housing 1, as shown in FIG. 3, and a positive electrode 21 and a negative electrode 22 of a power supply are disposed on the PCB board 2. Preferably, the positive electrode 21 and the negative electrode 22 of the power supply may be fastened to the PCB board 2 in a form of a spring plate.

The fan 3 is located between the PCB board 2 and the housing 1, so that when the electronic product works, the fan 3 is used to perform active heat dissipation by using the air vent 11 disposed on the housing 1, to enhance heat exchange between air in the external environment and air inside the electronic product. This can improve heat dissipation efficiency of the electronic product, improve reliability of the electronic product, and prolong a service life of the electronic product. A projection of the fan 3 on the PCB board 2 overlaps a projection of the air vent 11 on the PCB board 2, so that air flow generated by using the fan 3 can enter the external environment through the air vent 11 on the housing 1, and heat dissipation efficiency of the electronic product is further improved. Preferably, the fan 3 is a micro fan, but is not specifically limited in the present invention, and is specifically determined according to a requirement of a size and heat dissipation performance of the electronic product.

Figure 4:
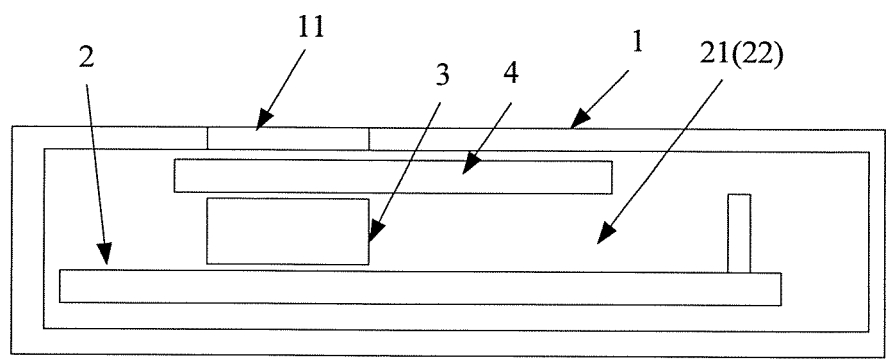
FIG. 4 is a schematic structural diagram in which the switch bar is set to a second state in the electronic product according to FIG. 1 of the present invention.

The switch bar 4 is located between the fan 3 and the housing 1 and is connected to the housing 1 in a sliding manner, where the switch bar 4 has a first state in which the air vent 11 is not completely blocked (as shown in FIG. 1) and a second state in which the air vent 11 is completely blocked (as shown in FIG. 4). The switch bar 4 includes a conductive area, and when the switch bar 4 is set to the first state, the conductive area is electrically connected to the positive electrode 21 and the negative electrode 22 of the power supply on the PCB board 2, so that the positive electrode 21 and the negative electrode 22 of the power supply are conducted, to provide a first drive signal to the fan 3 and enable the fan 3 to run. When the switch bar 4 is set to the second state, the conductive area of the switch bar 4 is disconnected from the positive electrode 21 and the negative electrode 22 of the power supply, and therefore, the positive electrode 21 and the negative electrode 22 of the power supply are in an open-circuit state, and the fan 3 stops running.

Figure 5:
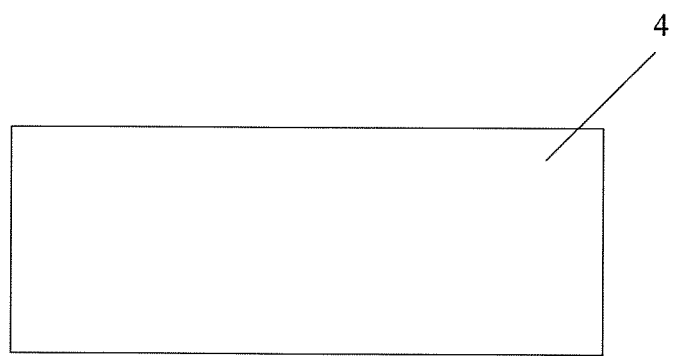
FIG. 5 is a top view of a switch bar in an electronic product according to an embodiment of the present invention.
Figure 6:
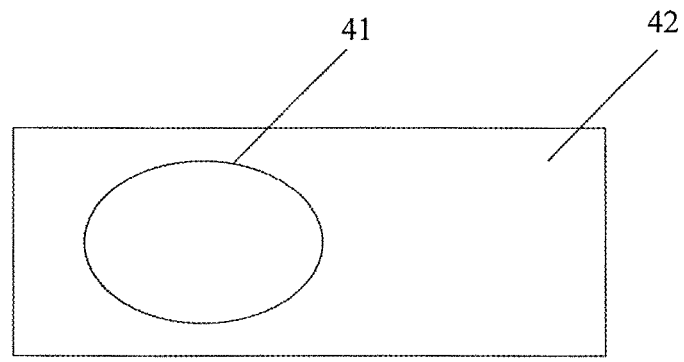
FIG. 6 is a top view of a switch bar in an electronic product according to another embodiment of the present invention.

In an embodiment of the present invention, as shown in FIG. 5, the switch bar 4 is an entire non-ventilation area; in another embodiment of the present invention, as shown in FIG. 6, the switch bar 4 includes a ventilation area 41 and a non-ventilation area 42 that encloses the ventilation area 41, which is not limited in the present invention and is determined according to a specific situation.

Figure 7:
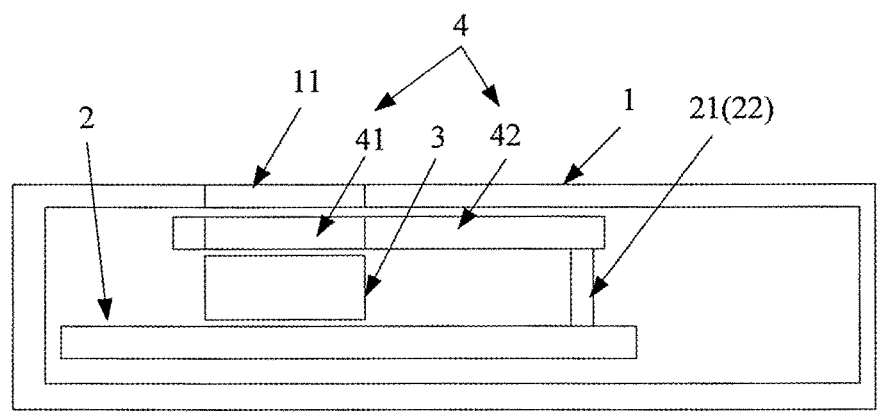
FIG. 7 is a schematic structural diagram in which the switch bar is set to a first state in the electronic product according to FIG. 6 of the present invention.
Figure 8:
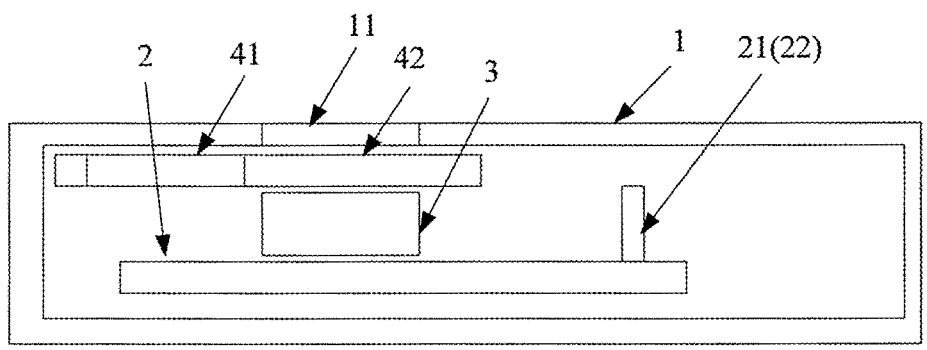
FIG. 8 is a schematic structural diagram in which the switch bar is set to a second state in the electronic product according to FIG. 6 of the present invention.
Figure 9:
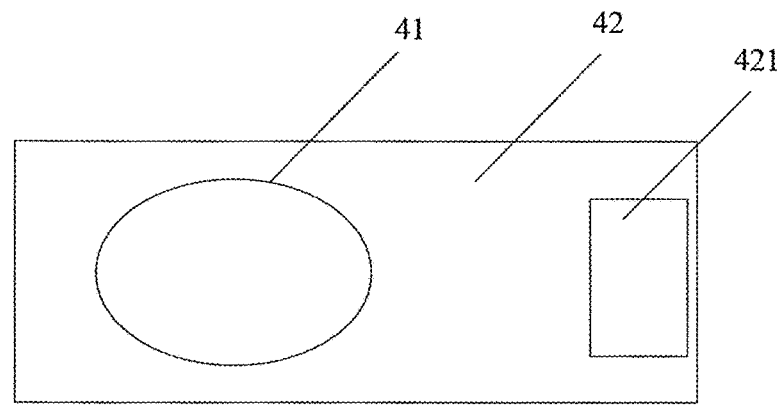
FIG. 9 is a top view of a switch bar in an electronic product according to still another embodiment of the present invention.
Figure 10:
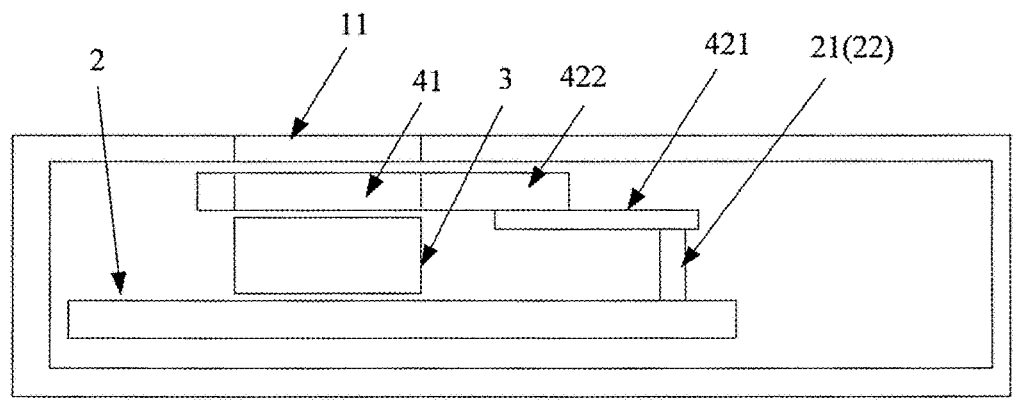
FIG. 10 is a schematic structural diagram in which a switch bar is set to a first state in an electronic product according to still another embodiment of the present invention.
Figure 11:
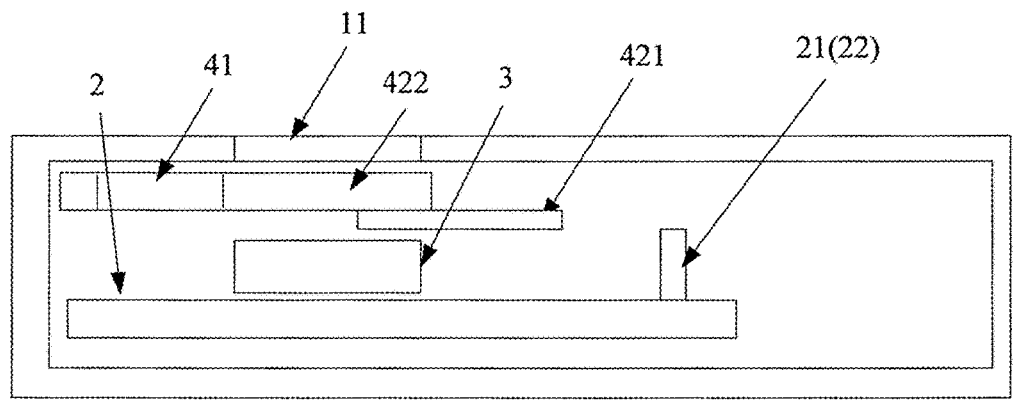
FIG. 11 is a schematic structural diagram in which the switch bar is set to a second state in the electronic product according to FIG. 10 of the present invention.

It should be noted that, when the switch bar 4 includes the ventilation area 41 and the non-ventilation area 42 that encloses the ventilation area 41, the switch bar 4 has the first state in which the ventilation area 41 directly faces the air vent 11 (as shown in FIG. 7) and the second state in which the non-ventilation area 42 completely blocks the air vent 11 (as shown in FIG. 8). In an example embodiment of this embodiment, as shown in FIG. 9, the conductive area 421 is located in the non-ventilation area 42, and when the switch bar 4 is set to the first state, the conductive area 421 is electrically connected to the positive electrode 21 and the negative electrode 22 of the power supply on the PCB board 2 (as shown in FIG. 10), so that the positive electrode 21 and the negative electrode 22 of the power supply are conducted, to provide the first drive signal to the fan 3 and enable the fan 3 to run. When the switch bar 4 is set to the second state, the conductive area 421 of the switch bar 4 is disconnected from the positive electrode 21 and the negative electrode 22 of the power supply (as shown in FIG. 11), and therefore, the positive electrode 21 and the negative electrode 22 of the power supply are in an open-circuit state, and the fan 3 stops running.

It can be learned that, in this embodiment of the present invention, the fan 3 can be used to perform active heat dissipation by using the air vent 11 on the housing 1 only when the electronic product works and the switch bar 4 is set to the first state. However, when the electronic product does not work, the switch bar 4 is set to the second state, and the fan 3 does not work, so as to reduce electric energy consumption of the electronic product. In addition, the air vent 11 on the housing 1 may be blocked by using the switching bar 4, so as to avoid a case in which performance of the electronic product is affected and a service life of the electronic product is shortened because dust in the external environment enters the inside of the electronic product through the air vent 11 on the housing 1.

Preferably, in an embodiment of the present invention, the projection of the fan 3 on the PCB board 2 is located inside a range of the projection of the air vent 11 on the PCB board 2, so that most of air flow generated by using the fan 3 can enter the external environment through the air vent 11 on the housing 1, to improve heat dissipation efficiency of the electronic product. More preferably, the projection of the fan 3 on the PCB board 2 coincides with the projection of the air vent 11 on the PCB board 2, to make full use of an effective area of the air vent 11 and the fan 3 and improve heat dissipation efficiency to a maximum extent.

Based on any one of the foregoing embodiments, in an embodiment of the present invention, the projection of the ventilation area 41 on the PCB board 2 covers the projection of the air vent 11 on the PCB board 2, so that air flow generated by using the fan 3 can enter the air vent 11 through the ventilation area 41 to a maximum extent, then enter the external environment through the air vent 11, and perform heat exchange with air in the external environment.

Preferably, the projection of the ventilation area 41 on the PCB board 2 coincides with the projection of the air vent 11 on the PCB board 2, which, however, is not limited in the present invention and is determined according to a specific situation.

Based on any one of the foregoing embodiments, in another embodiment of the present invention, as shown in FIG. 10 and FIG. 11, the non-ventilation area 42 further includes an insulation area 422, and the insulation area 422 is located between the conductive area 421 and the ventilation area 41 and encloses the ventilation area 41. Preferably, the conductive area 421 is a conductive copper sheet, but the present invention sets no limitation thereto provided that the conductive area 421 is made of a conductive material. It should be noted that the ventilation area 41 may include multiple meshes disposed in the insulation area 422, or may be one through hole disposed inside the insulation area 422, that is, the ventilation area 41 is a through hole that penetrates the switch bar 4, which, however, is not limited in the present invention and is determined according to a specific situation.

Figure 12:
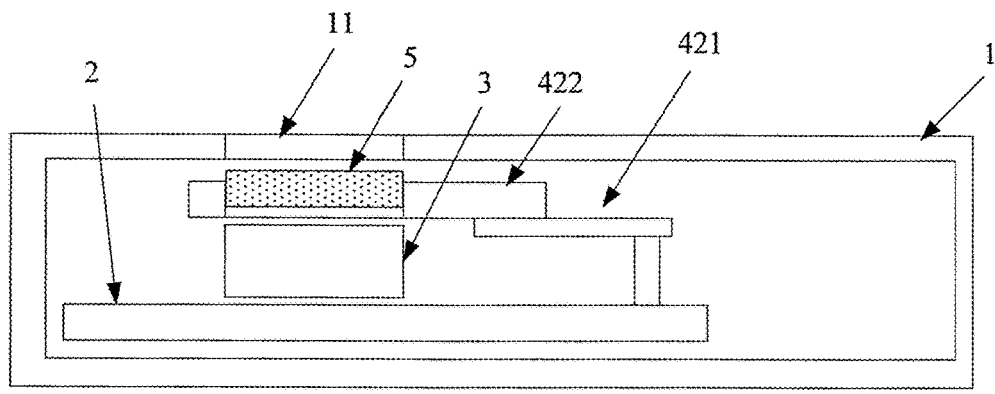
FIG. 12 is a schematic structural diagram in which a switch bar is set to a first state in an electronic product according to yet another embodiment of the present invention.

Preferably, the ventilation area 41 is one through hole disposed inside the insulation area 422, and an area of the through hole matches with an area of the air vent 11, to ensure heat dissipation efficiency. Based on this embodiment of the present invention, in still another embodiment of the present invention, as shown in FIG. 12, the electronic product further includes an air filter 5 that is located in the ventilation area 41 of the switch bar 4, and the air filter 5 filters air that passes through the ventilation area 41, so as to avoid a case in which reliability of the electronic product is affected and a service life of the electronic product is shortened because dust in the external environment enters the inside of the electronic product directly through both the air vent 11 on the housing 1 and the through hole on the switch bar 4 in a process in which heat dissipation is performed in the electronic product by using the fan 3, that is, the switch bar 4 is set to the first state.

Preferably, in a specific embodiment of the present invention, the air filter 5 and the switch bar 4 are permanently bonded, which, however, is not limited in the present invention, and is determined according to a specific situation.

Based on any one of the foregoing embodiments, in an embodiment of the present invention, a working state of the fan 3 depends only on a state of the switch bar 4, that is, when the switch bar 4 is set to the first state, the conductive area 421 of the switch bar 4 is electrically connected to the positive electrode 21 and the negative electrode 22 of the power supply on the PCB board 2, and the fan 3 starts to run; when the switch bar 4 is set to the second state, the conductive area 421 of the switch bar 4 is not electrically connected to the positive electrode 21 and the negative electrode 22 of the power supply on the PCB board 2, and the fan 3 stops running.

Figure 13:
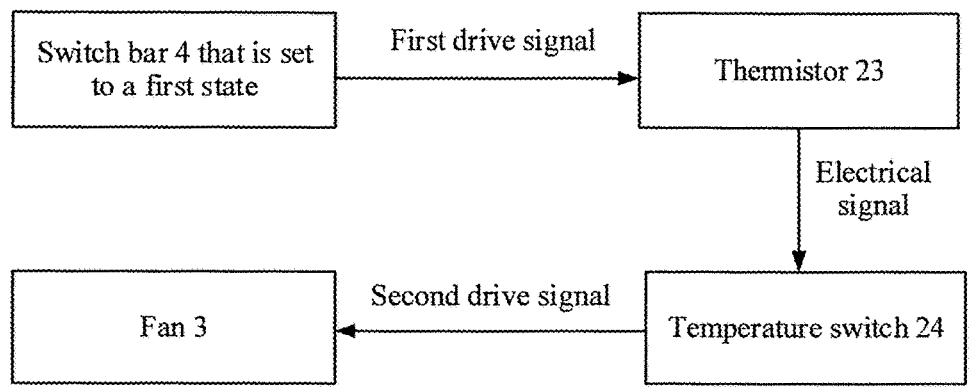
FIG. 13 is a schematic diagram of a working principle of an electronic product according to an embodiment of the present invention.

In another embodiment of the present invention, the electronic product further includes a thermistor 23 disposed on the PCB board 2 and a temperature switch 24 disposed on the PCB board 2. As shown in FIG. 13, the thermistor 23 is configured to: receive the first drive signal, detect temperature of the electronic product when receiving the first drive signal, convert a temperature signal detected by the thermistor 23 into an electrical signal, and output the electrical signal to the temperature switch 24; and the temperature switch 24 is configured to: determine the electrical signal output by the thermistor 23, and output a second drive signal to the fan 3 when the electrical signal reaches a preset value of the electrical signal, where the fan 3 starts to run when receiving the second drive signal.

In this embodiment, a working state of the fan 3 depends on both the switch bar 4 and the temperature switch 24. When the switch bar 4 is set to the first state, the conductive area 421 of the switch bar 4 is electrically connected to the positive electrode 21 and the negative electrode 22 of the power supply on the PCB board 2, and outputs the first drive signal; the thermistor 23 receives the first drive signal, starts to detect temperature of the electronic product when receiving the first drive signal, that is, when the switch bar 4 is set to the first state, then converts the temperature signal detected by the thermistor 23 into the electrical signal, and outputs the electrical signal to the temperature switch 24; the temperature switch 24 determines whether the signal received by the temperature switch 24 (that is, the electrical signal output by the thermistor 23) reaches the preset value. When the signal received by the temperature switch 24 reaches the preset value, the temperature switch 24 outputs the second drive signal to the fan 3, and the fan 3 starts to run; when the signal received by the temperature switch 24 does not reach the preset value, the temperature switch 24 does not output the second drive signal to the fan 3, and the fan 3 does not run.

It can be learned that, by using the electronic product provided in this embodiment of the present invention, the fan 3 is used to perform active heat dissipation only when temperature of the electronic product reaches a specific value; when temperature of the electronic product does not reach a specific value, that is, the temperature of the electronic product is relatively low, the fan 3 is not used to perform active heat dissipation, and instead, the air vent 11 on the housing 1 is used to perform natural heat dissipation, to reduce electric energy consumption of the electronic product, reduce an amount of dust passively absorbed from the external environment under the effect of the fan 3, reduce impact of dust on performance of the electronic product, and prolong a service life of the electronic product.

It should be noted that, in this embodiment of the present invention, when the switch bar 4 is set to the first state, the thermistor 23 detects the temperature of the electronic product in real time or detects the temperature of the electronic product at a preset time interval, to further reduce electric energy consumption of the electronic product. This is not limited in the present invention and is determined according to a specific situation.

It should be further noted that, in the foregoing embodiments, the preset value is not limited in the embodiments of the present invention and is specifically determined according to energy consumption of the electronic product and a performance requirement of the electronic product.

Based on any one of the foregoing embodiments, switch between the first state and the second state of the switch bar 4 may be automatically controlled or may be manually controlled, which is not limited in the present invention and is determined according to a specific situation.

In an embodiment of the present invention, when the switch between the first state and the second state of the switch bar 4 is implemented by automatic control, a working state of the switch bar 4 is preferably controlled by a power switch of the electronic product, that is, when the power switch of the electronic product is on, the switch bar 4 is set to the first state, and when the power switch of the electronic product is off, the switch bar 4 is set to the second state.

Figure 14:
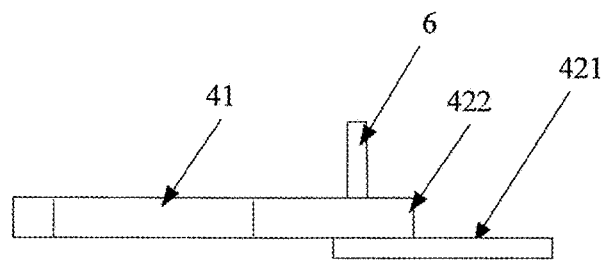
FIG. 14 is a partial schematic structural diagram of an electronic product according to an embodiment of the present invention.

In another embodiment of the present invention, when the switch between the first state and the second state of the switch bar 4 is implemented by manual control, in this embodiment, as shown in FIG. 14, preferably, the electronic product further includes a rocker switch 6 that is connected to the switch bar 4 in a fastened manner, so that switch between the states of the switch bar 4 can be implemented by using the rocker switch 6.

Based on any one of the foregoing embodiments, in an embodiment of the present invention, the air vent 11 on the housing 1 may be one through hole that penetrates the housing 1 or may include multiple meshes that penetrate the housing 1, which is not limited in the present invention and is determined according to a specific situation. It should be noted that, when the air vent 11 on the housing 1 may be one through hole that penetrates the housing 1, in another embodiment of the present invention, the electronic product further includes an air filter that is disposed at a position of the air vent 11, so as to filter air that passes through the air vent 11, which, however, is not limited in the present invention either and is determined according to a specific situation.

It should be further noted that, in any one of the foregoing embodiments, a shape of a section that is of the air vent 11 on the housing 1 and that is perpendicular to a direction from the PCB board 2 to the housing 1 may be a circle, an ellipse, or any other shape, which is not limited in the present invention and is determined according to a specific situation. Similarly, a shape of the through hole on the switch bar 4 is not limited in this embodiment of the present invention either provided that the shape matches with a shape of the air vent 11 on the housing 1.

In conclusion, the electronic product provided in the embodiments of the present invention includes: the housing 1, where the air vent 11 is disposed on the housing 1; the PCB board 2 that is located inside the housing 1, where the positive electrode 21 and the negative electrode 22 of the power supply are disposed on the PCB board 2; the fan 3 that is located between the PCB board 2 and the housing 1; and the switch bar 4 that is located between the fan 3 and the housing 1 and is connected to the housing 1 in the sliding manner, where the switch bar 4 has the first state in which the air vent 11 is not completely blocked and the second state in which the air vent 11 is completely blocked, where the switch bar 4 includes the conductive area, when the switch bar 4 is set to the first state, the conductive area is electrically connected to the positive electrode 21 and the negative electrode 22 of the power supply on the PCB board 2, to provide the first drive signal to the fan 3, and the fan 3 starts to run. Therefore, when the electronic product provided in the embodiments of the present invention works, the switch bar 4 may be set to the first state, and the fan 3 is used to perform active heat dissipation by using the air vent 11 disposed on the housing 1, to enhance heat exchange between air in the external environment and air inside the electronic product. This can improve heat dissipation efficiency of the electronic product, improve reliability of the electronic product and prolong the service life of the electronic product.

In addition, when the electronic product provided in the embodiments of the present invention does not work, the switch bar 4 may be set to the second state, and the air vent 11 on the housing 1 is blocked by using the switch bar 4, so as to avoid the case in which performance of the electronic product is affected and the service life of the electronic product is shortened because dust in the external environment enters the inside of the electronic product through the air vent 11 on the housing 1.

The parts in this specification are all described in a progressive manner, for same or similar parts, reference may be made to these parts, and each part focuses on a difference from other parts.

The embodiments disclosed above are described to enable a person skilled in the art to implement or use the present invention. Various modifications to the embodiments are obvious to the person skilled in the art, and general principles defined in this specification may be implemented in other embodiments without departing from the spirit or scope of the present invention. Therefore, the present invention will not be limited to the embodiments described in this specification but extends to the widest scope that complies with the principles and novelty disclosed in this specification.

What is claimed is:

1. An electronic product, comprising:
a housing, wherein an air vent is disposed on the housing;
a PCB board disposed inside the housing, wherein a positive electrode and a negative electrode of a power supply are disposed on the PCB board;
a fan disposed between the PCB board and the housing, wherein a projection of the fan on the PCB board overlaps a projection of the air vent on the PCB board;
a switch bar disposed between the fan and the housing and connected to the housing in a sliding manner, wherein the switch bar has a first state in which the air vent is not completely blocked and a second state in which the air vent is completely blocked;
wherein the switch bar comprises a conductive area, and when the switch bar is set to the first state, the conductive area is electrically connected to the positive electrode and the negative electrode of the power supply on the PCB board, to provide a first drive signal to the fan and enable the fan to run;
wherein the switch bar comprises a ventilation area and a non-ventilation area that encloses the ventilation area, and when the switch bar is set to the first state, the ventilation area directly faces the air vent, and when the switch bar is set to the second state, the non-ventilation area completely blocks the air vent; and
wherein the conductive area is located in the non-ventilation area of the switch bar.

2. The electronic product according to claim 1, wherein the projection of the fan on the PCB board coincides with the projection of the air vent on the PCB board.

3. The electronic product according to claim 1, wherein a projection of the ventilation area on the PCB board covers the projection of the air vent on the PCB board.

4. The electronic product according to claim 1, wherein the non-ventilation area further comprises an insulation area, and the insulation area is located between the conductive area and the ventilation area and encloses the ventilation area.

5. The electronic product according to claim 1, wherein the ventilation area is a through hole that penetrates the switch bar.

6. The electronic product according to claim 5, further comprising:
an air filter that is located in the ventilation area of the switch bar, and the air filter filters air that passes through the ventilation area.

7. The electronic product according to claim 6, wherein the air filter and the switch bar are permanently bonded.

8. The electronic product according to claim 1, wherein the conductive area is a conductive copper sheet.

9. The electronic product according to claim 1, further comprising:
a rocker switch that is connected to the switch bar in a fastened manner, wherein switching between states of the switch bar is implemented by using the rocker switch.

10. An electronic product comprising:
a housing, wherein an air vent is disposed on the housing;
a PCB board disposed inside the housing, wherein a positive electrode and a negative electrode of a power supply are disposed on the PCB board;
a fan disposed between the PCB board and the housing, wherein a projection of the fan on the PCB board overlaps a projection of the air vent on the PCB board;
a switch bar disposed between the fan and the housing and connected to the housing in a sliding manner, wherein the switch bar has a first state in which the air vent is not completely blocked and a second state in which the air vent is completely blocked, wherein the switch bar comprises a conductive area, and when the switch bar is set to the first state, the conductive area is electrically connected to the positive electrode and the negative electrode of the power supply on the PCB board, to provide a first drive signal to the fan for enabling the fan to run;

a thermistor disposed on the PCB board and configured to:
receive the first drive signal,
detect temperature of the electronic product when receiving the first drive signal, and
convert a temperature signal detected by the thermistor into an electrical signal; and a temperature switch disposed on the PCB board and is configured to:
receive the electrical signal from the thermistor, and
output a second drive signal to the fan when the electrical signal reaches a preset value of the electrical signal, wherein the second drive signal is for controlling the fan to start to run.

\* \* \* \* \*